United States Patent

Sobolewski

(10) Patent No.: US 9,829,520 B2
(45) Date of Patent: Nov. 28, 2017

(54) LOW FREQUENCY IMPEDANCE MEASUREMENT WITH SOURCE MEASURE UNITS

(75) Inventor: Gregory Sobolewski, Brecksville, OH (US)

(73) Assignee: Keithley Instruments, LLC, Solon, OH (US)

( * ) Notice: Subject to any disclaimer, the term of this patent is extended or adjusted under 35 U.S.C. 154(b) by 341 days.

(21) Appl. No.: 13/214,693

(22) Filed: Aug. 22, 2011

(65) Prior Publication Data

US 2014/0145729 A1     May 29, 2014

(51) Int. Cl.
*G01R 27/02*     (2006.01)

(52) U.S. Cl.
CPC ............ *G01R 27/02* (2013.01); *G01R 27/025* (2013.01)

(58) Field of Classification Search
USPC ........................................................ 324/713
See application file for complete search history.

(56) References Cited

U.S. PATENT DOCUMENTS

| | | | | |
|---|---|---|---|---|
| 4,885,528 | A * | 12/1989 | Tanaka et al. | 324/713 |
| 7,616,008 | B1 * | 11/2009 | Rayman et al. | 324/607 |
| 7,633,308 | B1 | 12/2009 | Sobolewski et al. | |
| 8,547,120 | B1 * | 10/2013 | Sobolewski et al. | 324/713 |
| 2005/0083068 | A1 * | 4/2005 | Clarridge | G01R 35/005 324/601 |
| 2005/0099188 | A1 | 5/2005 | Baxter | |
| 2006/0036382 | A1 | 2/2006 | Paz et al. | |
| 2007/0259256 | A1 * | 11/2007 | Le Canut et al. | 429/90 |
| 2008/0303538 | A1 * | 12/2008 | Orr | 324/707 |
| 2009/0121705 | A1 * | 5/2009 | Rzehak | G01R 22/10 324/142 |
| 2010/0188111 | A1 | 7/2010 | Fougere | |

\* cited by examiner

*Primary Examiner* — Jeff Natalini
(74) *Attorney, Agent, or Firm* — Pearne & Gordon LLP; Andrew J. Harrington

(57) ABSTRACT

A method for measuring the impedance of a DUT having a capacitance of less than 1 pF includes applying a voltage or current signal to the DUT, the voltage or current signal including an AC component having a non-zero frequency of less than 1 kHz; monitoring a current or voltage signal, respectively, through the DUT in response to the voltage or current signal; digitizing the voltage signal and the current signal synchronously; and calculating the impedance from the digitized voltage and current signals.

1 Claim, 3 Drawing Sheets

LOW FREQUENCY IMPEDANCE MEASUREMENT WITH SOURCE MEASURE UNITS

BACKGROUND OF THE INVENTION

The present invention relates to the measurement of impedances and, in particular, to high impedances at low frequencies.

The measurement of very high impedances can present difficulties. This is because the impedances involved are so large that the voltage applied to the device under test (DUT) is exceedingly large and/or the resulting current is exceedingly small. For example, using too high of a voltage can result in device breakdown or even arcing. In the case of capacitances, low frequencies exacerbate the problems, because the impedance is inversely related to the frequency.

Source measure units (SMUs) are well-known in the precision DC electrical measurement field for their ability to very accurately source a DC voltage signal and measure the resulting DC current signal or vice versa. For example, SMUs are available that can selectively source a DC voltage from a microvolt or less to a kilovolt or more and measure a DC current from an attoampere or less to an ampere or more (or vice versa). In DC measurement regimes, this permits the measurement of extremely high impedances (i.e., R=V/I).

SUMMARY OF THE INVENTION

A method for measuring the impedance of a DUT having a capacitance of less than 1 pF includes applying a voltage or current signal to the DUT, the voltage or current signal including an AC component having a non-zero frequency of less than 1 kHz; monitoring a current or voltage signal, respectively, through the DUT in response to the voltage or current signal; digitizing the voltage signal and the current signal synchronously; and calculating the impedance from the digitized voltage and current signals.

DESCRIPTION OF THE PREFERRED EMBODIMENTS

Figure 1:
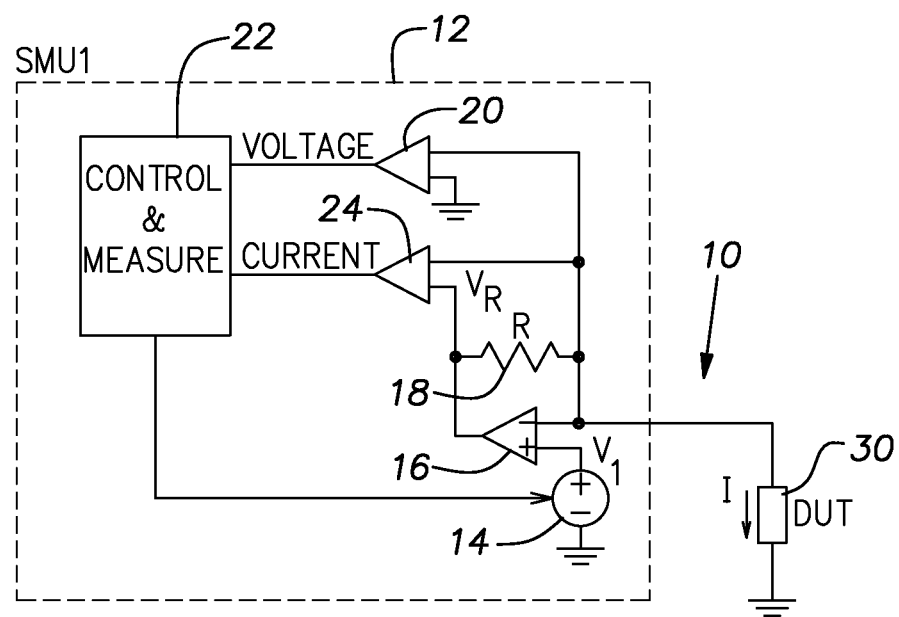
FIG. 1 is a schematic diagram of an example of a measurement configuration for performing an aspect of the invention.

Referring to FIG. 1, a measurement configuration 10 includes an example of an idealized source measure unit (SMU) 12 connected to a device under test (DUT) 30. An adjustable voltage source 14 provides the voltage $V_1$ to the non-inverting input of an operational amplifier 16. The feedback loop provided by the resistor 18 (R) forces the inverting input of the operational amplifier 16 to the value of $V_1$ also. Note that the feedback loop is the source of the current I through the DUT 30 as well. As a result, the voltage drop across the resistor 18 is proportional to the current through the DUT 30 (i.e., $V_R$=IR or I=$V_R$/R).

The buffer amplifier 20 provides a buffered version of the voltage $V_1$ (which is the value of the voltage across the DUT 30) to the control and measurement section 22 and the buffer amplifier 24 provides a buffered version of the voltage $V_R$ as a scaled (by R) version of the current through the DUT 30 to the control and measurement section 22. The control and measurement section 22 also controls the desired value $V_1$ of the adjustable voltage source 14.

The control and measurement section 22 includes the ability to measure the values of the voltage $V_1$ and the current I including digitizing the values. The control and measurement section 22 also controls the desired value $V_1$ of the adjustable voltage source 14.

While essentially a DC device, the SMU 12 does fortuitously include the capability to adjust the value $V_1$ of the adjustable voltage source 14. Within the bandwidth constraints of the feedback loops of the SMU 12, the value of $V_1$ can be varied periodically by the control and measurement section 22 to produce an AC signal. Typically, the bandwidth limits of the SMU 12 is 1 kHz or less. This allows the SMU 12 to source, for example, a corresponding sinusoidal AC voltage signal of 1 kHz or less.

To measure the impedance of a DUT 30 having primarily a small capacitance (e.g., 1 pF or less) at these low frequencies, the periodically varying voltage signal $V_1$ is applied to the DUT 30 and the current signal I through the DUT 30 is monitored. The control and measurement section 22 synchronously digitizes the voltage signal and the current signal in order that the impedance of the DUT 30 may be calculated. This is a complex value that includes, for example, not only the capacitive component but may also a resistive component typical of a non-ideal capacitive device.

In the case of a 1 kHz frequency, a 1 pF capacitance and a nominally 1 kV voltage signal, the capacitive impedance would be approximately 160 megohms and the current would be on the order of 6 microamps. Considering that the SMU 12 may be capable of measuring attoamps, it can be seen the much lower frequencies and very much higher impedances can be measured without utilizing excessive voltages.

The control and measurement section 22 can advantageously calculate the impedance from the digitized voltage and current using such techniques as discrete Fourier transforms (DFTs) which are often implemented using fast Fourier transform (FFT) algorithms.

Figure 2:
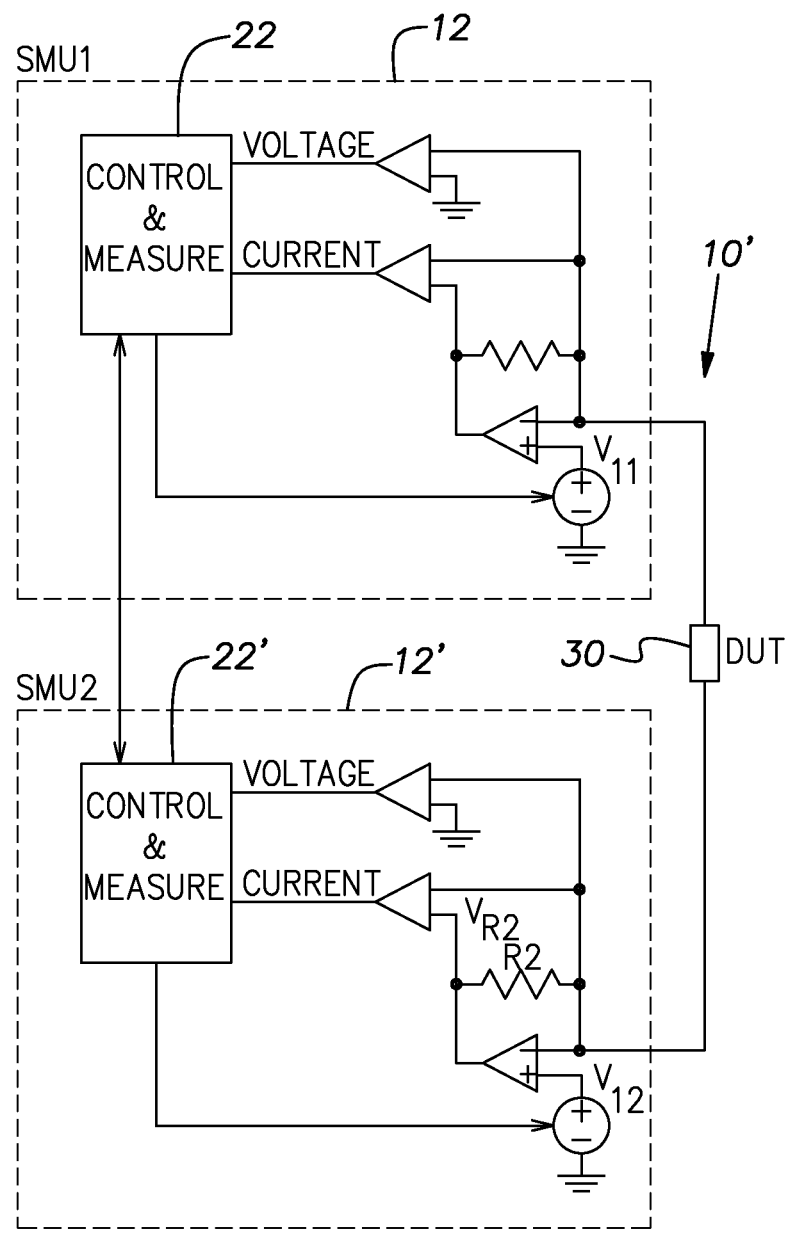
FIG. 2 is a schematic diagram of another example of a measurement configuration for performing another aspect of the invention.

In real-world operation, the measurement configuration 10 may be somewhat compromised by stray impedances in parallel with the DUT 30 (e.g., SMU output impedance, cable leakage, test and fixture impedances). Referring to FIG. 2, improved performance can be obtained with the measurement configuration 10' which uses two SMUs 12, 12'.

The SMU 12 applies an AC voltage component to the DUT 30 while the SMU 12' provides a DC bias voltage signal that the AC component rides on top of. This forces the return of all AC signals flowing through the DUT into the SMU 12'. Therefore, voltage measured across the DUT and current measured by the SMU 10' can be used as an accurate representation of signals resulting from the DUT 30 impedance. The respective control and measurement sections 22, 22' communicate with each other and again, DFTs can be used to make impedance calculations. The voltage across the DUT 30 is $V_{11}$-$V_{12}$ and the current though the DUT 30 is $V_{R2}/R_2$.

Figure 3:
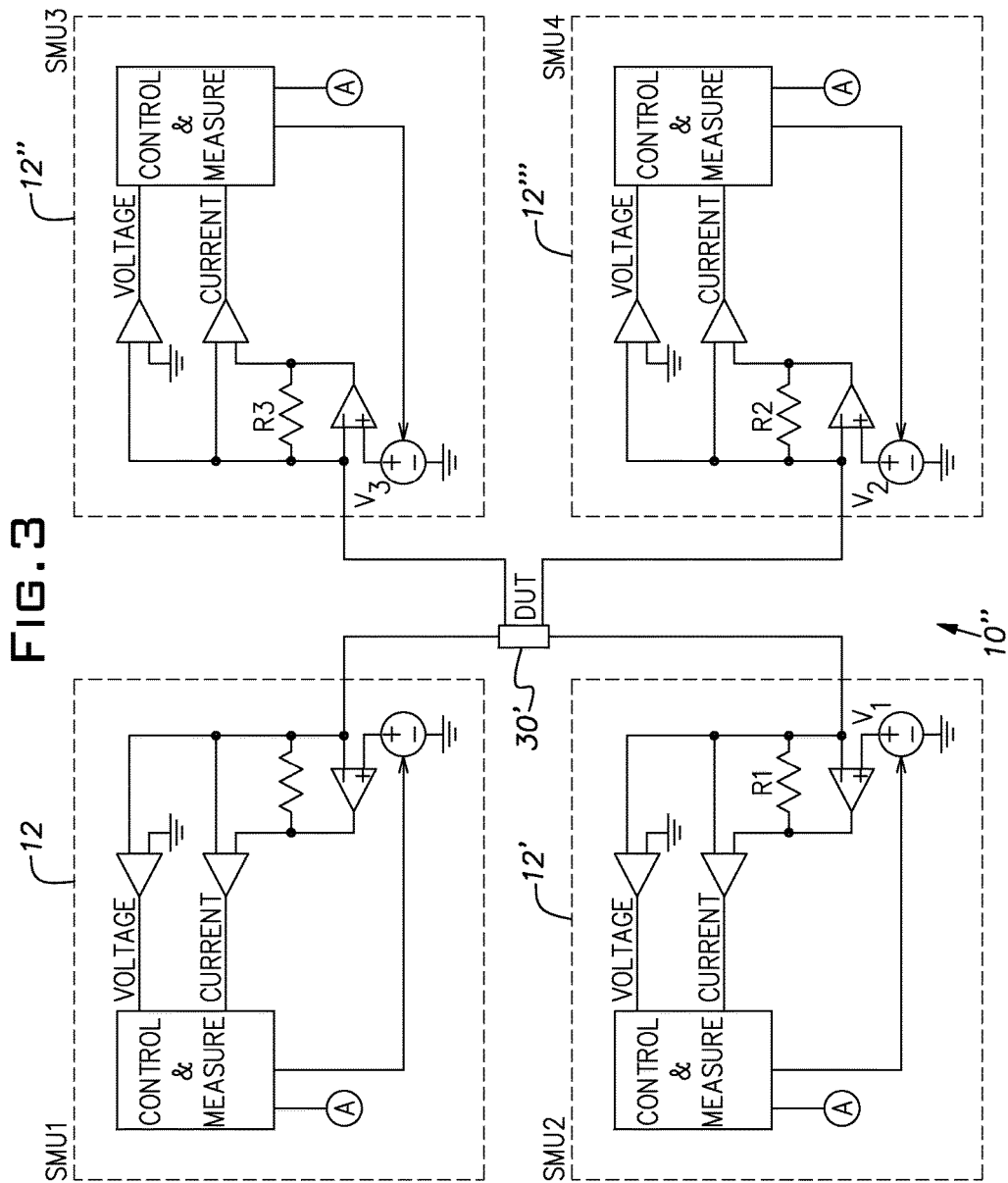
FIG. 3 is a schematic diagram of still another example of a measurement configuration for performing still another aspect of the invention.

The configuration of FIG. 2 can be extended to provide simultaneous multipin capacitance measurements. For example, referring to FIG. 3, the SMU 12 can be used to provide an AC voltage signal component to the DUT 30' while the SMUs 12', 12" and 12'" can each provide a DC bias for a respective test point on the DUT 30' and measure the current through the DUT 30' between the SMU 10 and the respective test point. The respective SMU control and measurement sections are interconnected (A). The respective impedances can then be calculated as above.

It should be noted that because of the duality of voltage and current, instead of voltages being applied and currents measured, currents may be applied and voltages measured to produce a measurement of the impedance of the DUT. SMUs are particularly useful in such applications because they are designed to interchangeably source voltage and measure current or to source current and measure voltage.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A method for measuring the impedance of a DUT having a capacitance of less than 1 pF, said method comprising:

applying a voltage signal produced by a first source measure unit to said DUT, said voltage signal including an AC component having a non-zero frequency of less than 1 kHz;

monitoring with a second source measure unit a current signal through said DUT in response to said voltage signal;

digitizing said voltage signal and said current signal synchronously; and calculating said impedance from said digitized voltage and current signals, wherein said second source measure unit adds a DC bias voltage to said voltage signal and the difference of the voltage signal and the DC bias voltage is applied through a second source measure sensing impedance resulting in said current signal being forced through said DUT by said source measure units.

* * * * *